(12) United States Patent
Madge et al.

(10) Patent No.: US 6,787,379 B1
(45) Date of Patent: Sep. 7, 2004

(54) METHOD OF DETECTING SPATIALLY CORRELATED VARIATIONS IN A PARAMETER OF AN INTEGRATED CIRCUIT DIE

(75) Inventors: Robert Madge, Portland, OR (US); Kevin Cota, Portland, OR (US); Bruce Whitefield, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 67 days.

(21) Appl. No.: 10/020,407

(22) Filed: Dec. 12, 2001

(51) Int. Cl.[7] .............................................. H01L 21/66
(52) U.S. Cl. ............................ 438/17; 438/14; 324/522
(58) Field of Search ........................ 324/522; 438/14, 438/15, 17, 460

(56) References Cited

U.S. PATENT DOCUMENTS

| | | | | |
|---|---|---|---|---|
| 5,889,408 A | * | 3/1999 | Miller | 324/765 |
| 5,889,409 A | * | 3/1999 | Kalb, Jr. | 324/765 |
| 6,239,606 B1 | * | 5/2001 | Miller | 324/765 |
| 6,342,790 B1 | * | 1/2002 | Ferguson et al. | 324/765 |
| 2002/0102747 A1 | * | 8/2002 | Muradian et al. | 438/14 |

OTHER PUBLICATIONS

Thibeault, C., "On the Comparison of IDDQ and IDDQ Testing", VLSI Test Symposium, 1999, Proceedings. 17th IEEE, pp. 143–150.*

Sabade et al. "Improved wafer–level spatial analysis for IDDQ limit setting", Test Conference, 2001, Proceedings. International, pp. 82–91.*

Kruseman et al., "The future of delta IDDQ testing", International Test Conference, 2001, pp. 101–110.*

Thibeault, C., "Improving delta–IDDQ–based test methods", International Test Conference, 2000, pp. 207–216.*

* cited by examiner

*Primary Examiner*—Michael Trinh
(74) *Attorney, Agent, or Firm*—Fitch, Even, Tabin & Flannery

(57) ABSTRACT

A method of detecting spatially correlated variations that may be used for detecting statistical outliers in a production lot of integrated circuits to increase the average service life of the production lot includes measuring a selected parameter of each of a plurality of electronic circuits replicated on a common surface; calculating a difference between a value of the selected parameter at a target location and a value of the selected parameter an identical relative location with respect to the target location for each of the plurality of electronic circuits to generate a distribution of differences; calculating an absolute value of the distribution of differences; and calculating an average of the absolute value of the distribution of differences to generate a representative value for the residual for the identical relative location.

3 Claims, 4 Drawing Sheets

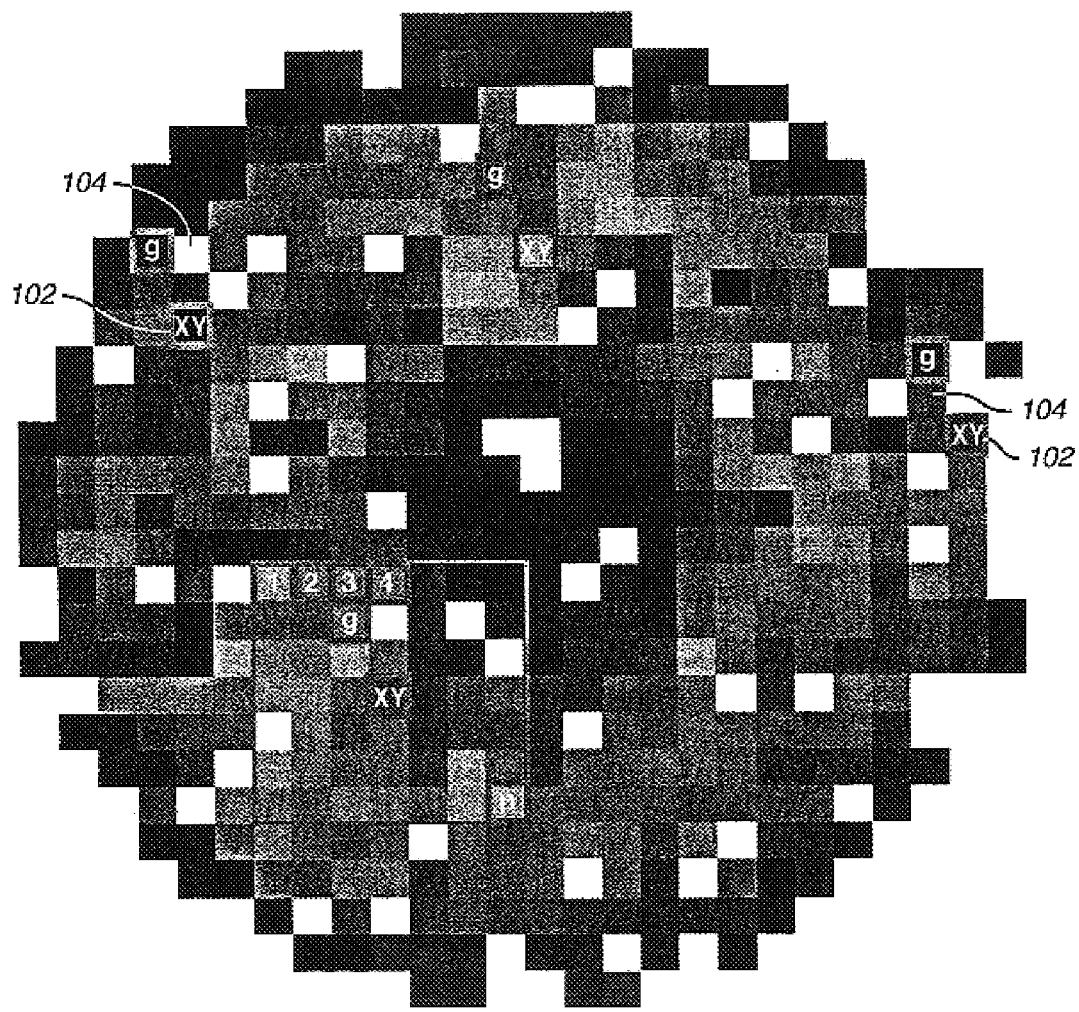
FIG._1

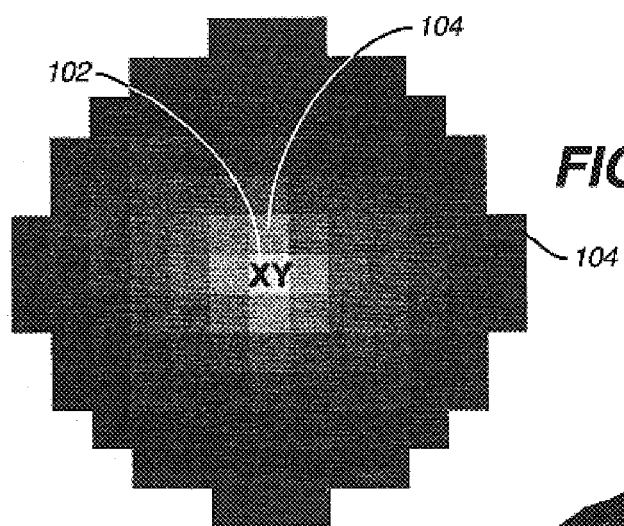
FIG._2A
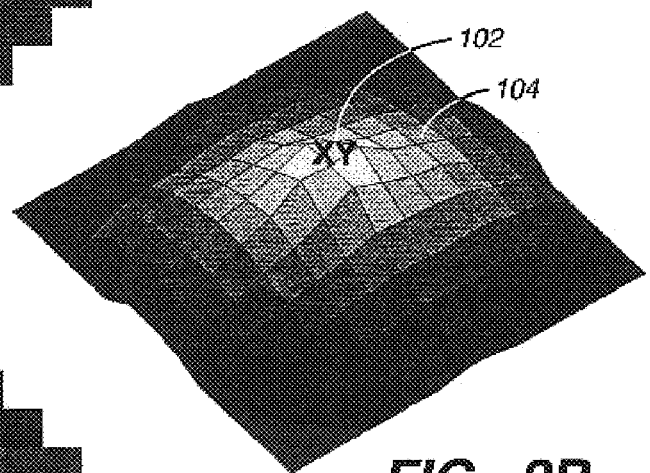
FIG._2B
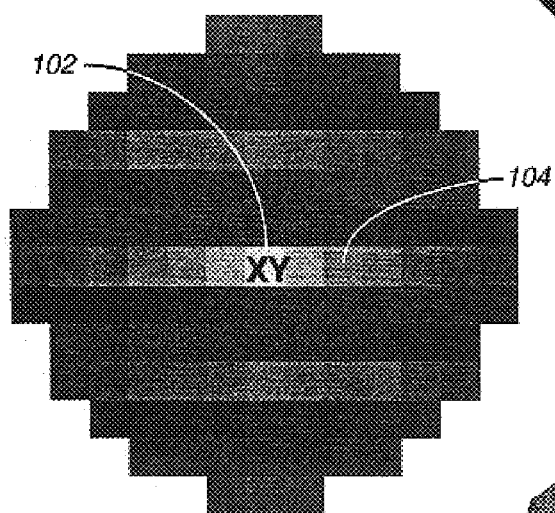
FIG._3A
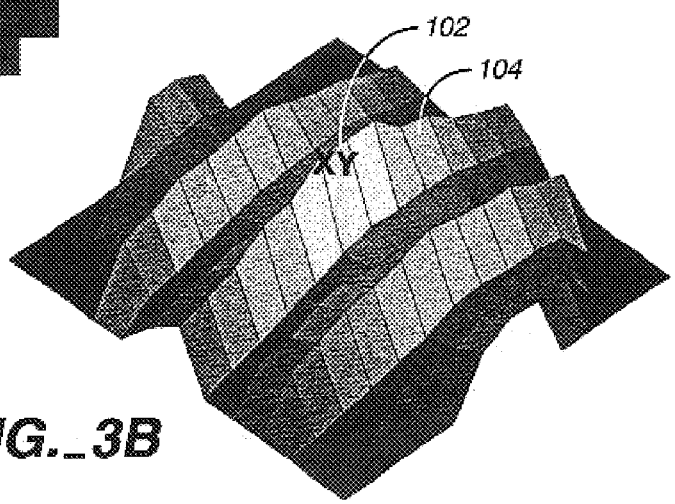
FIG._3B

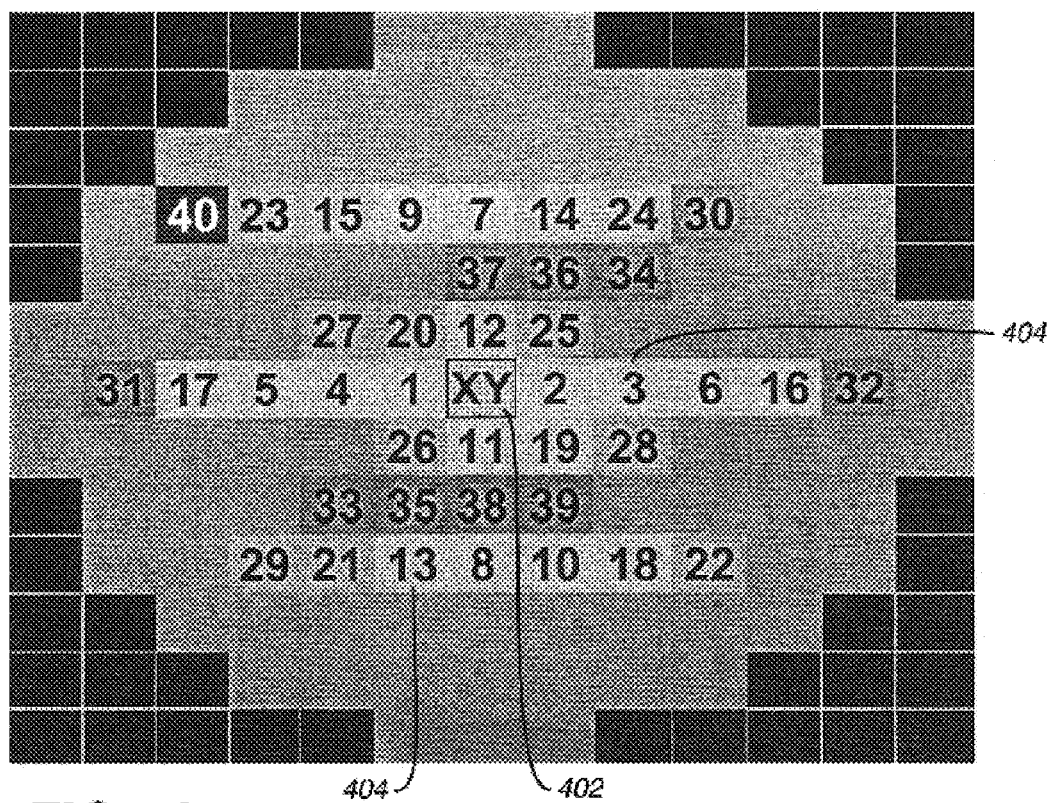
FIG._4
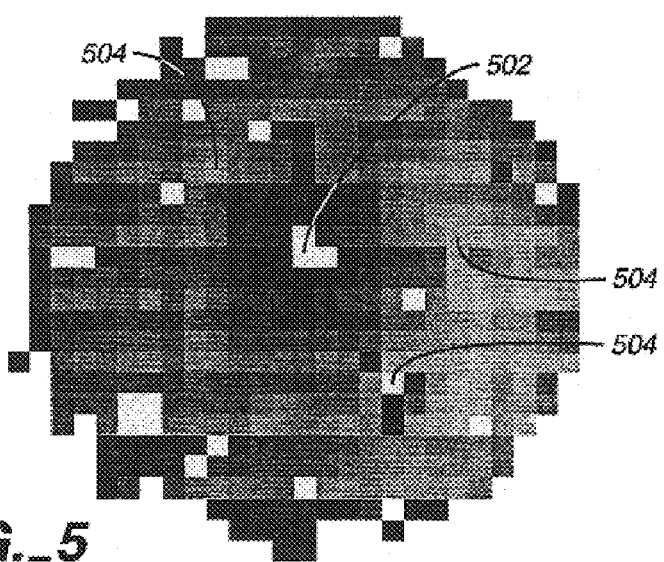
FIG._5

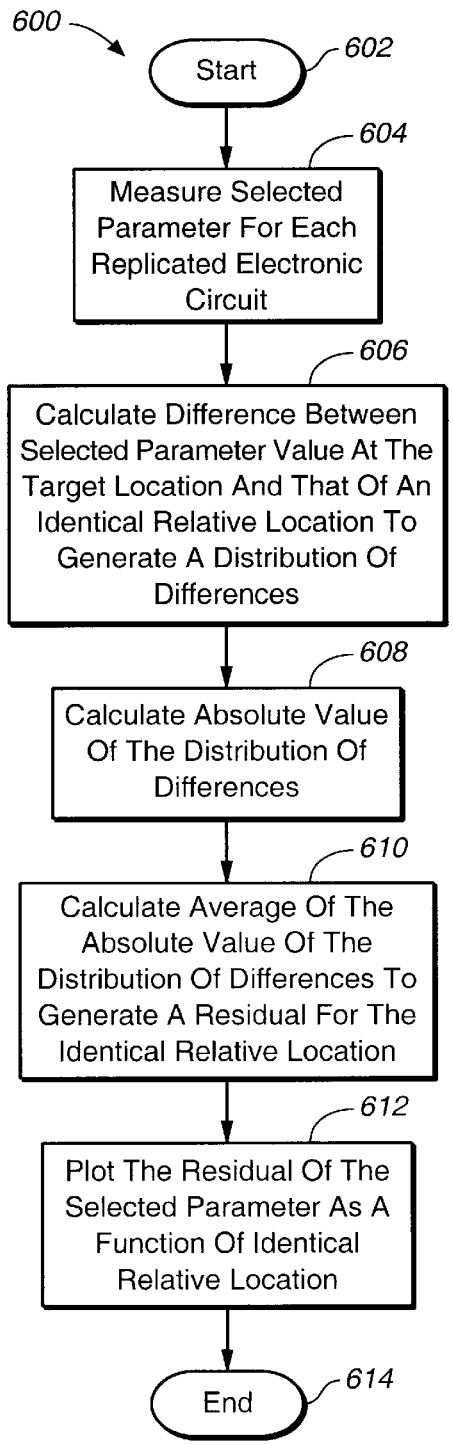
FIG._6
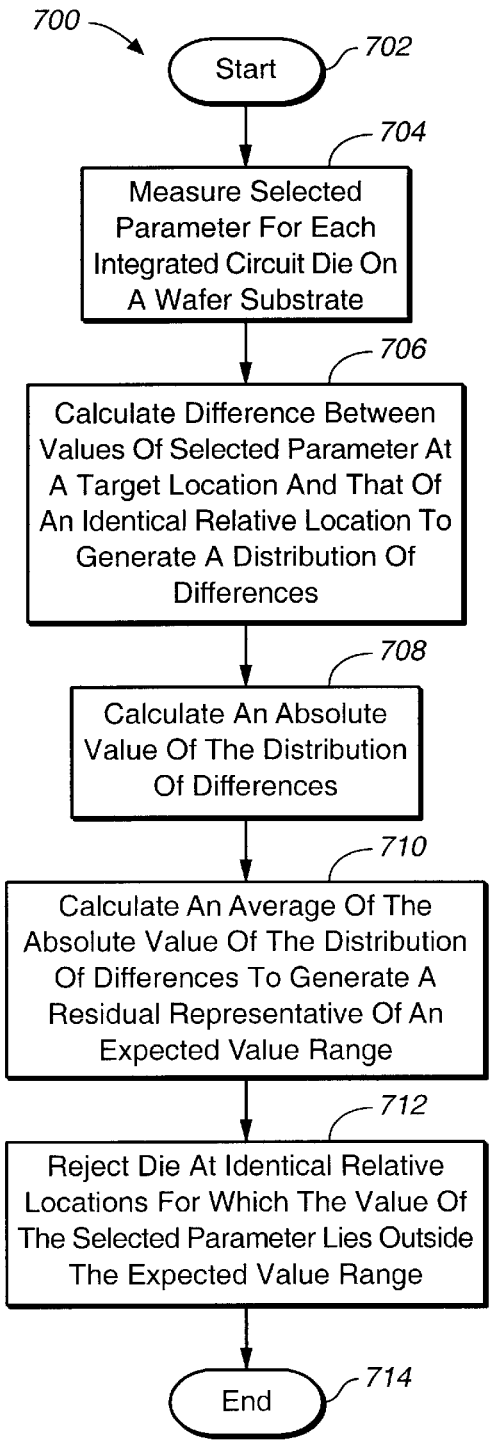
FIG._7

US 6,787,379 B1

METHOD OF DETECTING SPATIALLY CORRELATED VARIATIONS IN A PARAMETER OF AN INTEGRATED CIRCUIT DIE

FIELD OF THE INVENTION

The present invention relates generally to the testing of integrated circuit dies on a wafer during manufacture. More specifically, but without limitation thereto, the present invention relates to reducing the variation of a selected parameter in a production lot of integrated circuit die.

BACKGROUND OF THE INVENTION

An important issue in the manufacture of integrated circuits is detecting and rejecting integrated circuit die replicated on a silicon wafer that exhibit values of a selected parameter, for example, quiescent current (Iddq), that differ significantly from a mean value of the parameter. Integrated circuit die having values of the selected parameter that differ from the mean value by more than a selected threshold are called statistical outliers. Statistical outliers may pass performance testing, however, they may be more subject to premature failure and thus reduce the average service life of a production lot. Accordingly, a need exists for a method of detecting the statistical outliers.

SUMMARY OF THE INVENTION

In one aspect of the present invention, a method of detecting spatially correlated variations includes measuring a selected parameter of each of a plurality of electronic circuits replicated on a common substrate; calculating a difference between a value of the selected parameter at a target location and that of an identical relative location with respect to the target location for each of the plurality of electronic circuits to generate a distribution of differences; calculating an absolute value of the distribution of differences; and calculating an average of the absolute value of the distribution of differences to generate a residual for the identical relative location.

In another aspect of the present invention, a process for reducing the variation of a selected parameter of an integrated circuit die includes measuring a selected parameter of each of a plurality of integrated circuit die replicated on a wafer substrate; calculating a difference between a value of the selected parameter at a target location and that of an identical relative location with respect to the target location for each of the plurality of integrated circuit die to generate a distribution of differences; calculating an absolute value of the distribution of differences; calculating an average of the absolute value of the distribution of differences to generate a residual for the identical relative location that is representative of an expected value range of the selected parameter at the identical relative location; and rejecting any of the plurality of integrated circuit die having a value of the selected parameter that lies outside the expected value range.

DESCRIPTION OF THE SEVERAL VIEWS OF THE DRAWINGS

The present invention is illustrated by way of example and not limitation in the accompanying figures, in which like references indicate similar elements throughout the several views of the drawings, and in which:

FIG. 1 illustrates a typical distribution of average die quiescent current for a replicated pattern of integrated circuit die on a silicon wafer;

FIG. 2A illustrates a plot of residual quiescent current as a function of relative die location according to an embodiment of the present invention representative of a smooth process variation;

FIG. 2B illustrates a three-dimensional mesh of the plot in FIG. 2A;

FIG. 3A illustrates a plot of residual quiescent current as a function of relative die location according to an embodiment of the present invention representative of a non-continuous process variation;

FIG. 3B illustrates a three-dimensional mesh of the plot of FIG. 3A;

FIG. 4 illustrates an ordered rank of the top 40 die that are the most highly correlated with the target die from the location average results of FIGS. 3A and 3B;

FIG. 5 illustrates average die quiescent current plotted as a function of wafer location with stepper/reticle effects;

FIG. 6 illustrates a flow chart of a method of detecting variations in a spatially correlated parameter in accordance with an embodiment of the present invention; and FIG. 7 illustrates a flow chart of a process for reducing the variance of a selected parameter of an integrated circuit die replicated on a silicon wafer in accordance with an embodiment of the present invention.

Elements in the figures are illustrated for simplicity and clarity and have not necessarily been drawn to scale. For example, the dimensions of some of the elements in the figures may be exaggerated relative to other elements to help to improve understanding of embodiments of the present invention.

DESCRIPTION OF THE ILLUSTRATED EMBODIMENTS

Current approaches for detecting statistical outliers are based on the assumption that die located closest to one another on the wafer have the most highly correlated parameter values, resulting in a dominant spatial pattern that is continuous. In other words, the closer the die are to each other on the silicon wafer, the more highly correlated are the corresponding values of a selected parameter. However, the dominant spatial pattern may not be continuous. For example, die located at similar reticle positions may result in corresponding values of a selected parameter that are less correlated for neighboring die than for die located at similar reticle positions.

A reticle is a finely resolved picture that often contains multiple images of the same die pattern. The die patterns in the reticle are transferred simultaneously from the reticle to the silicon wafer according to well known techniques of photolithography as the reticle image is stepped across the silicon wafer. Due to the effects on the light traveling through the reticle to the silicon wafer, the exact pattern is not perfectly maintained across all copies of the die pattern. The result of these effects are often related to the relative positions of the die patterns within the reticle. If these effects dominate a process step that would otherwise cause a continuous change in a parameter value, then the reticle dependence pattern results in a higher correlation of parameter values in non-adjacent die than in adjacent, or "nearest neighbor", die.

Using test data, die-to-die correlations of a selected parameter may be calculated by averaging measured values of a selected parameter of die having an identical relative location with respect to a target location of each die on the silicon wafer respectively. A target location is the location of a specific die on the silicon wafer. A relative location is the location of a die displaced from the target location by a specific difference in the X-Y coordinates. An example of a relative location is (–5,10), that is, 5 units in the negative-X direction and 10 units in the positive-Y direction with respect to the target location. For a target die having X-Y coordinates (150,300), the corresponding die having the relative location (–5,10) would have the X-Y coordinates (145, 310). For a target die having the X-Y coordinates (620,222), the corresponding die having the identical relative location would have the X-Y coordinates (615,232). For a target die having the X-Y coordinates (500,800), the corresponding die having the identical relative location would have the X-Y coordinates (495,810), and so on. For each target die on the wafer, there is a corresponding die having the identical relative location, except near the edges of the wafer, where the identical relative location may not lie on the wafer.

Because a single production lot provides test data that allows for calculating die-to-die correlations of a selected parameter for each relative location from 5,000 to 10,000 or more times, an adequate sample is provided to obtain a highly resolved plot of the residual of the selected parameter as a function of relative location. Die having values of the selected parameter that exceed an expected value range may be identified as statistical outliers and rejected from the production lot, thereby increasing the average service life of the production lot.

By calculating die-to-die correlations of a selected parameter of an integrated circuit die as a function of identical relative location on a silicon wafer, a highly resolved image may be obtained of not only the major spatially correlated patterns across the wafer, but also of more subtle patterns resulting from the manufacturing process.

FIG. 1 illustrates a typical distribution of average die quiescent current for a replicated pattern of integrated circuit die on a silicon wafer. Shown in FIG. 1 are target die locations 102 and corresponding die relative locations 104. A gray scale is used to indicate the variation of the quiescent current at each of the target die locations 102. The variable g is an index that identifies the specific relative location 104 of a corresponding die with respect to each of the target die locations 102. The variable g ranges from 1 to n, where n is selected to include as large or as small an area around each of the target die locations 102 as desired for correlating values of the selected parameter. In the illustrated example, n equals 49, and the selected parameter is quiescent current (Iddq), however, other values of n and other selected parameters may be used to suit specific applications.

The residual of the selected parameter is calculated by measuring the value of the selected parameter at each of the target die locations 102 on the wafer and calculating the difference between the value of the selected parameter of a target die location 102 and the value of the selected parameter of the corresponding die at an identical relative location g with respect to each of the target die locations 102 to generate a distribution of differences. For example, if the measured values of the selected parameter at five of the target locations 102 are 1.5, 1.2, 1.3, 1.6, and 0.9, and the measured values of the selected parameter at an identical relative location (–5, 10) with respect to each of the five target locations 102 are 1.3, 1.1, 1.4, 1.5, and 1.3, then the distribution of differences would be 1.5–1.3=0.2, 1.2–1.1= 0.1, 1.3–1.4=–0.1, 1.6–1.5=0.1, and 0.9–1.3=–0.4. The average of the absolute value of the distribution of differences for an identical relative location g is defined as the residual of the relative location g. The absolute value of the distribution of differences in this example is 0.2, 0.1, 0.1, 0.1, and 0.4. The average of the absolute value of the distribution of the 5 differences in this example is 0.2+0.1+ 0.1+0.1+0.4/5=0.18. The residual of the selected parameter for the relative location (–5, 10) is thus 0.18. In like manner, the residual of each of relative locations 104 may be calculated.

FIG. 2A illustrates a plot of residual quiescent current as a function of relative location according to an embodiment of the present invention representative of a smooth process variation. Shown in FIG. 2A are a target die location 102 and corresponding die locations 104.

In FIG. 2A, a gray scale is used to indicate the relative value of the residual quiescent current calculated for each of the identical relative locations 104, where white indicates the lowest variation in the quiescent current with respect to the target die location 102. As shown in FIG. 2A, the variation in residual quiescent current increases with distance from the target die X-Y location 102, which identifies smooth process variation as the only spatial pattern. In this case, a nearest neighbor residual process may be used according to well known techniques to identify statistical outliers.

FIG. 2B illustrates a three-dimensional mesh of the plot in FIG. 2A. Shown in FIG. 2B are a target die X-Y location 102 and neighboring die locations 104.

In FIG. 2B, the gray scale is further enhanced by adding a third dimension that emphasizes the spatial pattern of the residual quiescent current.

FIG. 3A illustrates a plot of residual quiescent current as a function of relative die location according to an embodiment of the present invention representative of a non-continuous process variation. Shown in FIG. 3A are a target die location 102 and corresponding die locations 104.

In FIG. 3A, a gray scale is used to indicate the relative value of the residual quiescent current calculated for each of the identical relative locations 104, where white indicates the lowest variation in the quiescent current with respect to the target die location 102. As shown in FIG. 3A, the variation in residual quiescent current does not change monotonically with distance from the target die location 102 as in the example of FIG. 2A. The spatial pattern of the residual quiescent current in this example is non-continuous, therefore the nearest neighbor residual process, although possible, may be significantly improved for identifying statistical outliers. A more accurate method of identifying statistical outliers is to use the mean value of the selected parameter as a function of relative location to determine a best estimate of the expected parameter for each relative location.

FIG. 3B illustrates a three-dimensional mesh of the plot of FIG. 3A. The description of FIG. 2B also applies to FIG. 3B.

Plots similar to those of FIGS. 2A, 2B, 3A, and 3B may be generated to identify spatially correlated parameters in other electronic circuits replicated on a common substrate and in a variety of applications in which a common element is replicated in a spatial pattern.

FIG. 4 illustrates an ordered rank of the top 40 die that are the most highly correlated with the target die from the location average results of FIGS. 3A and 3B. Shown in FIG. 4 are a target die 402 and corresponding die relative locations 404 numbered by correlation rank width the target die 402.

As shown in FIG. 4, the relative locations most highly correlated with the target die lie on the same horizontal line as the target die.

FIG. 5 illustrates average die quiescent current plotted as a function of wafer location with stepper/reticle effects. Shown in FIG. 5 are a target die 502 and corresponding die relative locations 504.

The gray scale indicates the degree of correlation of average die quiescent current of the corresponding die relative locations 504 with the target die 502. As shown in FIG. 5, there is a combination of smooth variation and row dependent variation in quiescent current.

FIG. 6 illustrates a flow chart 600 of a method of detecting variations in a spatially correlated parameter in accordance with an embodiment of the present invention.

Step 602 is the entry point for the flow chart 600.

In step 604, a selected parameter of each of a plurality of electronic circuits replicated on a common substrate is measured according to well known techniques. The electronic circuit may be, for example, an integrated circuit die. The invention may also be practiced with any implementation of an electronic circuit or other device such as a micro-machine that may be replicated on a common substrate, and the term "electronic circuit" as used herein includes all such types of devices including micro-machines that may be replicated on a common substrate.

In step 606, a difference is calculated between a value of the selected parameter at a target location and that of an identical relative location with respect to the target location for each of the plurality of electronic circuits to generate a distribution of differences.

In step 608, an absolute value of the distribution of differences is calculated.

In step 610, an average of the absolute value of the distribution of differences is calculated to generate a representative value for the residual for the identical relative location. The calculated value is the mean absolute error, or if the median is used, the median absolute error.

Step 612 is the exit point for the flow chart 600.

The method illustrated in FIG. 6 may be used to detect spatial correlation of a variety of parameters of practically any device that may be replicated on a common substrate.

FIG. 7 illustrates a flow chart 700 of a process for reducing the variance of a selected parameter of an integrated circuit die replicated on a silicon wafer in accordance with an embodiment of the present invention.

Step 702 is the entry point for the flow chart 700.

In step 704, a selected parameter of each of a plurality of integrated circuit die replicated on a wafer substrate is measured according to well known techniques. For example, the selected parameter may be quiescent current (Iddq).

In step 706, a difference is calculated between a value of the selected parameter at a target location and a that of an identical relative location with respect to the target location for each of the plurality of integrated circuit die to generate a distribution of differences.

In step 708, an absolute value of the distribution of differences is calculated.

In step 710, an average of the absolute value of the distribution of differences is calculated to generate a representative value for the identical relative location having an expected value range of the selected parameter at the identical relative location. The expected value range may be, for example, the value of the selected parameter at the target location plus or minus one-half the residual.

In step 712, integrated circuit die at identical relative locations having a value of the selected parameter that lies outside the expected value range are rejected from the production lot. In the example described for FIG. 1, the die at the relative location (−5, 10) with respect to the first and the last of the five target locations would be rejected as statistical outliers, since they have values of the selected parameter that lie outside the range 1.3±0.18. Other values for the expected value range may be used to suit specific applications.

Step 714 is the exit point for the flow chart 700.

The method illustrated in FIG. 7 may be used to reduce the variation in a selected parameter in a production lot of integrated circuit dies, thereby increasing the reliability of the production lot.

In another embodiment of the present invention, the lot averaging may be performed for each wafer X-Y coordinate so that a new set of best estimates is re-calculated for each X-Y position. Re-calculating the best estimate locations includes the effects of edge die versus center die on the wafer.

In yet another embodiment, other wafers in the lot may be utilized for the location averaging. In this case, the best estimates for a given X-Y location may be the identical location on another wafer in the lot. This technique may be improved by re-ordering the wafers in the sequence in which they were processed to ensure more accurate estimation.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of detecting variations in a spatially correlated parameter comprising:

measuring a selected parameter of each of a plurality of electronic circuits replicated on a common substrate;

calculating a difference between a value of the selected parameter at a target location and that of an identical relative location with respect to the target location for each of the plurality of electronic circuits to generate a distribution of differences;

calculating an absolute value of the distribution of differences;

calculating an average of the absolute value of the distribution of differences to generate a representative value for the residual for the identical relative location; and performing a lot averaging for each wafer X-Y coordinate so that a new set of best estimates is re-calculated for each X-Y position.

2. A method of detecting variations in a spatially correlated parameter comprising:

measuring a selected parameter of each of a plurality of electronic circuits replicated on a common substrate;

calculating a difference between a value of the selected parameter at a target location and that of an identical relative location with respect to the target location for each of the plurality of electronic circuits to generate a distribution of differences;

calculating an absolute value of the distribution of differences; and calculating an average of the absolute value of the distribution of differences to generate a representative value for the residual for the identical relative location wherein the common substrate comprises a plurality of common substrates wherein best estimates for a given X-Y location are identical to those of a corresponding location on another of the plurality of common substrates.

3. The method of claim 2 further comprising re-ordering the plurality of common substrates in a same order in which they were processed.

* * * * *